(12) United States Patent
Yang (10) Patent No.: US 12,341,132 B2
(45) Date of Patent: Jun. 24, 2025

(54) SEMICONDUCTOR STRUCTURE (71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 484 days.

(21) Appl. No.: 17/807,759

(22) Filed: Jun. 20, 2022

(65) Prior Publication Data

US 2023/0282617 A1 Sep. 7, 2023

Related U.S. Application Data

(63) Continuation of application No. PCT/CN2022/091871, filed on May 10, 2022.

(30) Foreign Application Priority Data

Mar. 3, 2022 (CN) .......................... 202210208256.6

(51) Int. Cl.
*H01L 25/065* (2023.01)

(52) U.S. Cl.
CPC ............ *H01L 25/0657* (2013.01); *H01L 2225/06513* (2013.01); *H01L 2225/06537* (2013.01);
(Continued)

(58) Field of Classification Search
CPC ....... H01L 2225/06513; H01L 25/0657; H01L 25/03; H01L 2225/06541; H01L 23/481; H01L 23/5226
See application file for complete search history.

(56) References Cited

U.S. PATENT DOCUMENTS 8,941,233 B1 1/2015 Ngai et al.
9,515,054 B2 12/2016 Lee et al.
(Continued)

FOREIGN PATENT DOCUMENTS

CN 103545270 A 1/2014
CN 110098163 A 8/2019

OTHER PUBLICATIONS

International Search Report cited in PCT/CN2022/091871 mailed Sep. 28, 2022, 9 pages.

*Primary Examiner* — John A Bodnar
(74) *Attorney, Agent, or Firm* — Kilpatrick Townsend & Stockton LLP (57) ABSTRACT

The present disclosure provides a semiconductor structure, including a stacked structure, wherein the stacked structure includes a plurality of stacked semiconductor dies, and each of the semiconductor dies includes: a first base; a channel provided on the first base; and at least one first auxiliary through electrode and a plurality of connection through electrodes running through the first base, wherein the at least one first auxiliary through electrode is surrounded by the plurality of connection through electrodes, wherein connection through electrodes of adjacent ones of the semiconductor dies are connected through a first electrical connection structure to form a plurality of mutually isolated transmission paths, and each of the transmission paths is connected to at least one channel through at least one connection through electrode thereon.

8 Claims, 9 Drawing Sheets

(52) U.S. Cl.
CPC ............... *H01L 2225/06541* (2013.01); *H01L 2225/06589* (2013.01)

(56) References Cited

U.S. PATENT DOCUMENTS

| | | |
|---|---|---|
| 10,784,184 B2 | 9/2020 | Rho et al. |
| 2006/0197181 A1 | 9/2006 | Noguchi |
| 2010/0187670 A1 | 7/2010 | Lin et al. |
| 2015/0236003 A1* | 8/2015 | Konno ................ H01L 23/3128 438/107 |

* cited by examiner

SEMICONDUCTOR STRUCTURE

CROSS-REFERENCE TO RELATED APPLICATIONS

This is a continuation of International Application No. PCT/CN2022/091871, filed on May 10, 2022, which claims the priority to Chinese Patent Application No. 202210208256.6, titled "SEMICONDUCTOR STRUCTURE" and filed on Mar. 3, 2022. The entire contents of International Application No. PCT/CN2022/091871 and Chinese Patent Application No. 202210208256.6 are incorporated herein by reference.

TECHNICAL FIELD

The present disclosure relates to, but is not limited to, a semiconductor structure.

BACKGROUND

To meet requirements of miniaturization and efficiency improvement of integrated circuits (ICs), the packaging technology has been continuously improved. For a stacked memory device formed by using a stacked packaging technology, a chip area can be effectively utilized and a memory capacity can be increased. Semiconductor dies in the stacked memory device are usually electrically connected by through electrodes to implement a semiconductor device of high performance and high integration.

However, the through electrodes of the foregoing stacked memory device occupy a relatively large region, affecting structural compactness of the stacked memory device.

SUMMARY

An overview of the subject matter detailed in the present disclosure is provided below, which is not intended to limit the protection scope of the claims.

According to embodiments of the present disclosure, a semiconductor structure is provided, including a stacked structure, wherein the stacked structure includes a plurality of stacked semiconductor dies, and each of the semiconductor dies includes:
a first base;
a channel provided on the first base; and
at least one first auxiliary through electrode and a plurality of connection through electrodes running through the first base, wherein the at least one first auxiliary through electrode is surrounded by the plurality of connection through electrodes, wherein
connection through electrodes of adjacent ones of the semiconductor dies are connected through a first electrical connection structure to form a plurality of mutually isolated transmission paths, and each of the transmission paths is connected to at least one channel through at least one connection through electrode thereon.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A stacked semiconductor device is mainly used as an example for description herein. It may be understood that a semiconductor structure provided in the embodiments of the present disclosure is also applicable to another device with a same problem.

Figure 1:
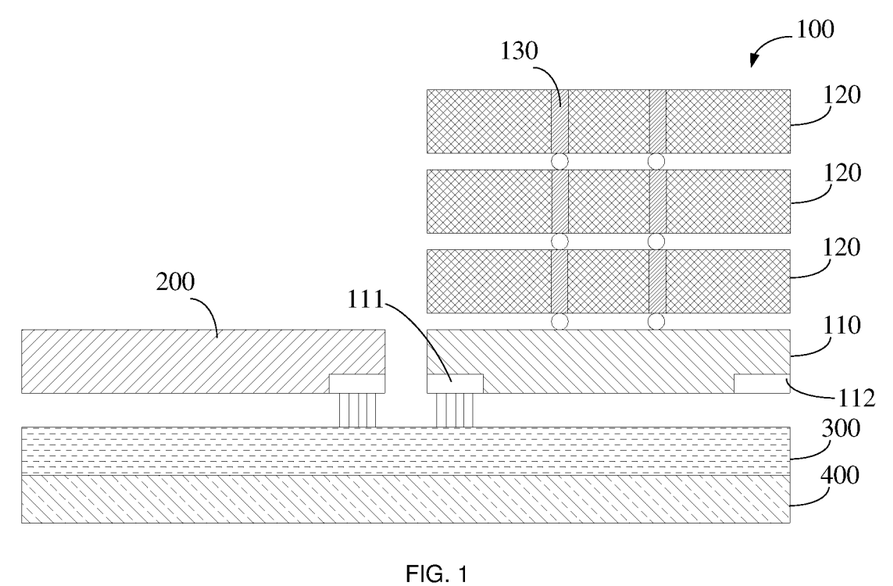
FIG. 1 is a schematic structural diagram of a semiconductor memory system.

A semiconductor memory system in which the stacked semiconductor device is located is first described as a whole. The semiconductor memory system may be implemented, for example, in a form of a system in a package (SIP) module, a multichip package (MCP) module, or a system-on-a-chip (SoC) module, or in a form of a package on a package (PoP) module that includes a plurality of package bodies. Referring to FIG. 1, the semiconductor memory system includes a stacked semiconductor device 100, a controller 200, an inserter 300, and a substrate 400. The inserter 300 is formed on the substrate 400. The stacked semiconductor device 100 and the controller 200 are formed above the inserter 300. For example, the stacked semiconductor device 100 and the controller 200 do not overlap each other in a vertical direction (that is, a direction perpendicular to the substrate).

The stacked semiconductor device 100 has a port physical layer (Physical, PHY) 111, and the port physical layer 111 may be connected to a port physical layer 111 of the controller 200 through the inserter 300 to implement communication between the stacked semiconductor device 100 and the controller 200. The stacked semiconductor device 100 further has a data access layer (Direct Access, DA) 112, and the data access layer 112 may be used to receive data such as test data.

The stacked semiconductor device 100 may be, for example, a high bandwidth memory (HBM). The HBM may include a plurality of stacked semiconductor dies 120. The semiconductor dies 120 are electrically connected to each other by using through electrodes 130. Still referring to FIG. 1, the HBM further includes a buffer layer 110. The plurality of semiconductor dies 120 are provided above the buffer layer 110. The port physical layer 111 and the data access layer 112 are provided on the buffer layer 110. The buffer layer 110 and the semiconductor die 120 are fixed together and the semiconductor dies 120 are fixed together by using a bonding process such as microbump bonding, and both are electrically connected to each other by using the through electrodes 130. A quantity of the semiconductor dies 120 is not limited. For example, the quantity may be three shown in FIG. 1. The quantity may be specifically set according to requirements. There may be one or more through electrodes 130 connected between the buffer layer 110 and the semiconductor die 120. Similarly, there may be one or more through electrodes 130 connected between the semiconductor dies 120.

Figure 2:
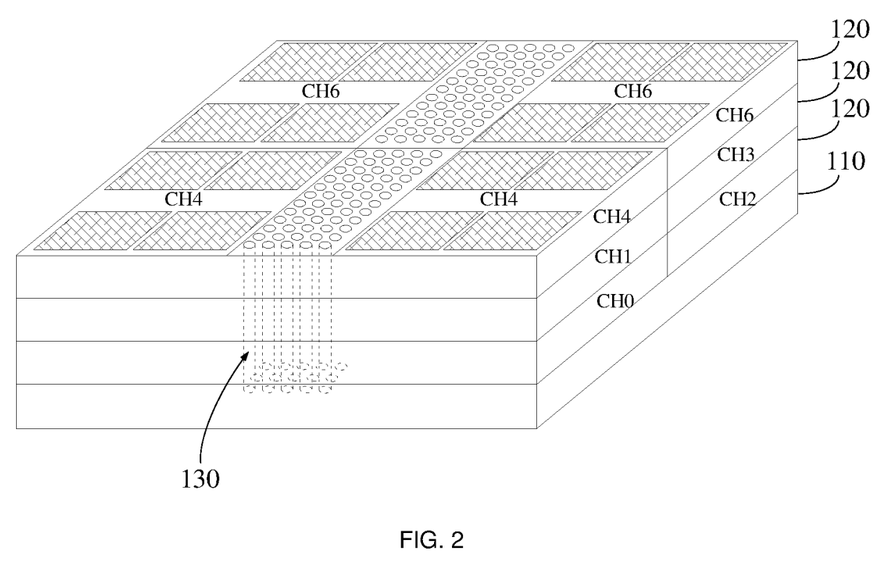
FIG. 2 is a schematic structural diagram of a stacked semiconductor device.

Each of the semiconductor dies 120 may include one or more channels. Each channel may include a memory cell array. The controller 200 can transmit data to and read data from each channel through the buffer layer 110. The channel may be configured with an independent memory interface. For example, as shown in FIG. 2, three semiconductor dies 120 are included, and each of the semiconductor dies 120 includes two channels. Therefore, the stacked semiconductor device includes a first channel CH0 to a sixth channel CH5. A plurality of through electrodes 130 running through the plurality of semiconductor dies 120 may be set to be respectively applied to the first channel CH0 to the sixth channel CH5.

Figure 3:
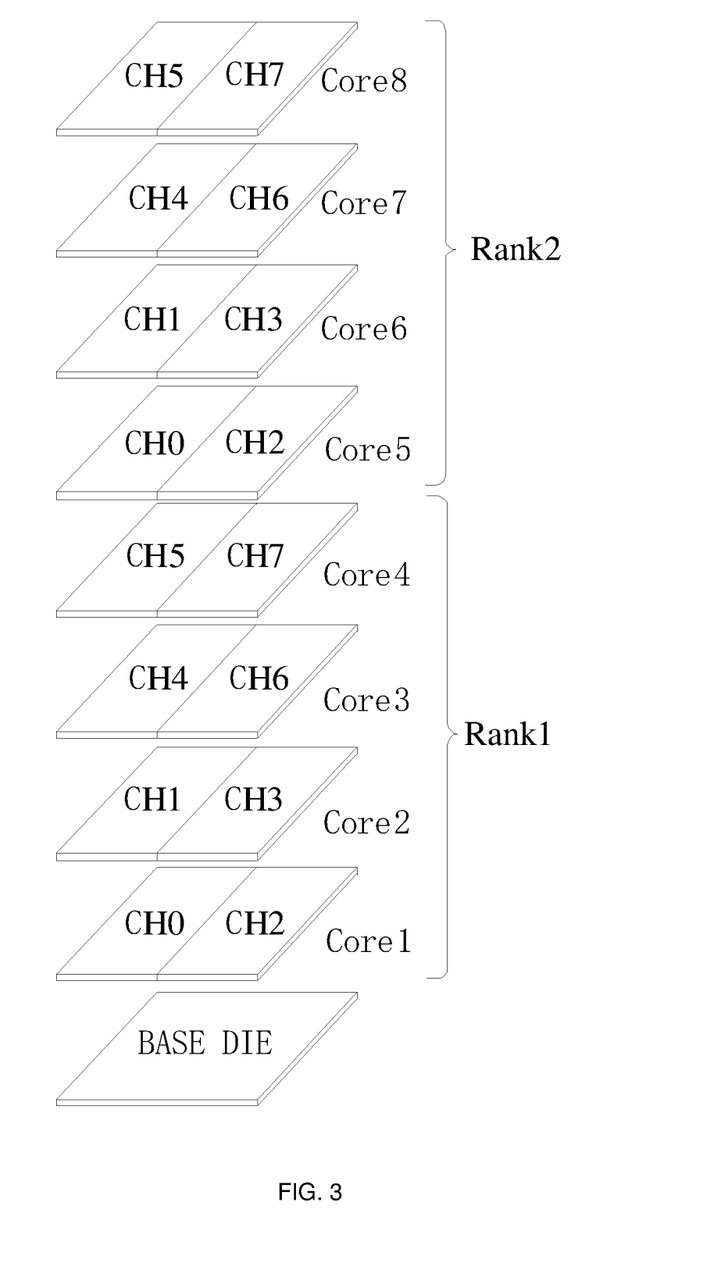
FIG. 3 is an exploded view of a stacked semiconductor device.

In order to independently transfer a selection signal to a specified semiconductor die, a plurality of mutually isolated spiral transmission paths are usually formed by using the through electrodes in the stacked semiconductor device. For example, as shown in FIG. 3, the stacked semiconductor device includes a buffer layer BASE DIE and two stacked semiconductor die sets: a die set Rank1 and a die set Rank2, provided above the buffer layer. Each semiconductor die set includes four semiconductor dies. A structure of the die is set Rank1 is the same as that of the die set Rank2. Specifically, the four semiconductor dies in the die set Rank1 are sequentially a die Core1, a die Core2, a die Core3, and a die Core4. The four semiconductor dies in the die set Rank 2 are sequentially a die Core5, a die Core6, a die Core7, and a die Core8. Each semiconductor die has two channels, with a channel CH0 and a channel CH2 on the die Core1, a channel CH1 and a channel CH3 on the die Core2, a channel CH4 and a channel CH6 on the die Core3, a channel CH5 and a channel CH7 on the die Core4, a channel CH0 and a channel CH2 on the die Core5, a channel CH1 and a channel CH3 on the die Core6, a channel CH4 and a channel CH6 on the die Core7, and a channel CH5 and a channel CH7 on the die Core8.

Figure 4:
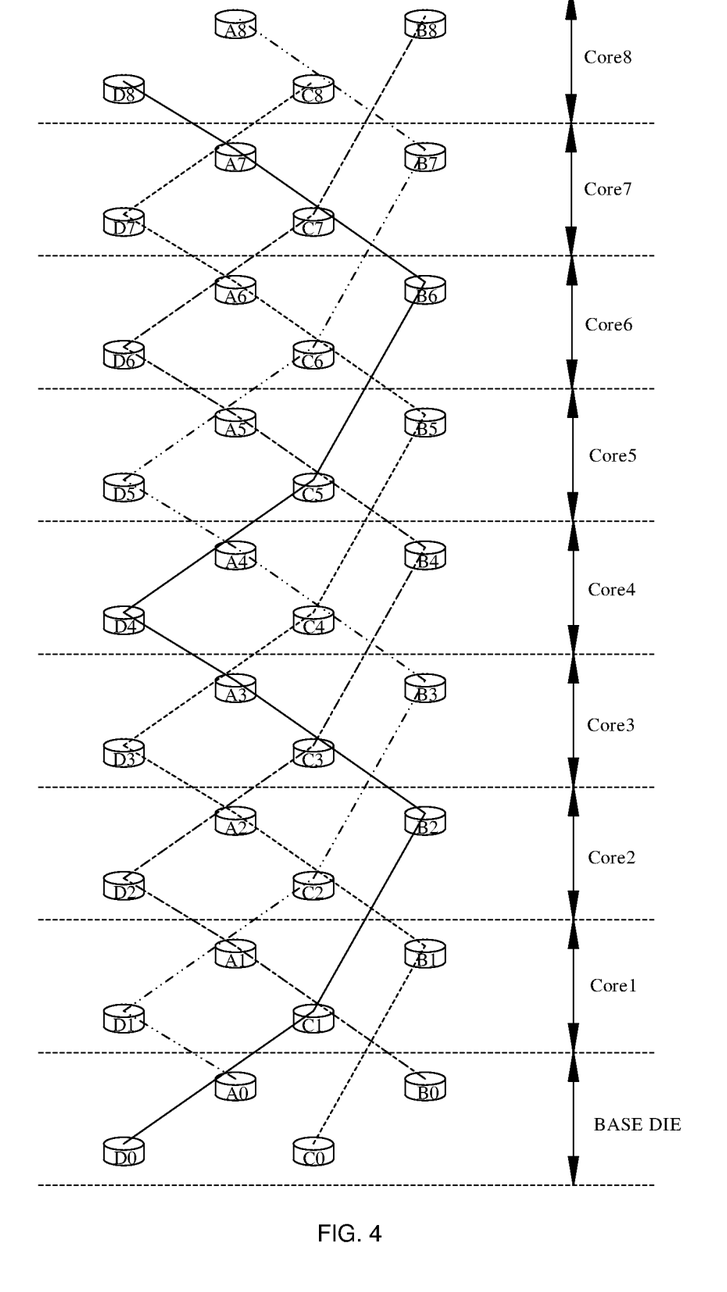
FIG. 4 is a schematic connection diagram of through electrodes in the stacked semiconductor device shown in FIG. 3.

The buffer layer is connected to an adjacent die by using transfer through electrodes 133. Dies are electrically connected to each other by using connection through electrodes 132. The transfer through electrodes on the buffer layer and the connection through electrodes 132 on the dies are arranged as shown in FIG. 4. The buffer layer is provided with transfer through electrodes A0, B0, C0, and D0. The die Core1 is correspondingly provided with connection through electrodes A1, B1, C1, and D1. The die Core2 is correspondingly provided with connection through electrodes A2, B2, C2, and D2. The die Core3 is correspondingly provided with connection through electrodes A3, B3, C3, and D3. The die Core4 is correspondingly provided with connection through electrodes A4, B4, C4, and D4. The die Core5 is correspondingly provided with connection through electrodes A5, B5, C5, and D5. The die Core6 is correspondingly provided with connection through electrodes A6, B6, C6, and D6. The die Core7 is correspondingly provided with connection through electrodes A7, B7, C7, and D7. The die Core8 is correspondingly provided with connection through electrodes A8, B8, C8, and D8. As shown in FIG. 4, the transfer through electrodes and the connection through electrodes are connected in a specific manner to form four transmission paths, which are specifically:

a transmission path 1 (dash-double-dotted line): A0-D1-C2-B3-A4-D5-C6-B7-A8;

a transmission path 2 (dash-dotted line): B0-A1-D2-C3-B4-A5-D6-C7-B8;

a transmission path 3 (dashed line): C0-B1-A2-D3-C4-B5-A6-D7-C8; and a transmission path 4 (solid line): D0-C1-B2-A3-D4-C5-B6-A7-D8.

The transmission path 1 is used to connect the channel CH0 on the die Core1 and is the channel CH0 on the die Core5. The transmission path 2 is used to connect the channel CH1 on the die Core2 and the channel CH1 on the die Core6. The transmission path 3 is used to connect the channel CH4 on the die Core3 and the channel CH4 on the die Core7. The transmission path 4 is used to connect the channel CH5 on the die Core4 and the channel CH5 on the die Core8.

Figure 5:
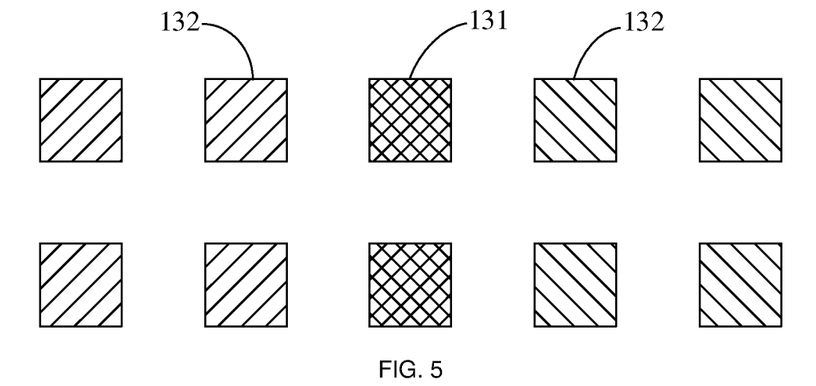
FIG. 5 is a schematic arrangement diagram of through electrodes in the stacked semiconductor device shown in FIG. 3.
Figure 6:
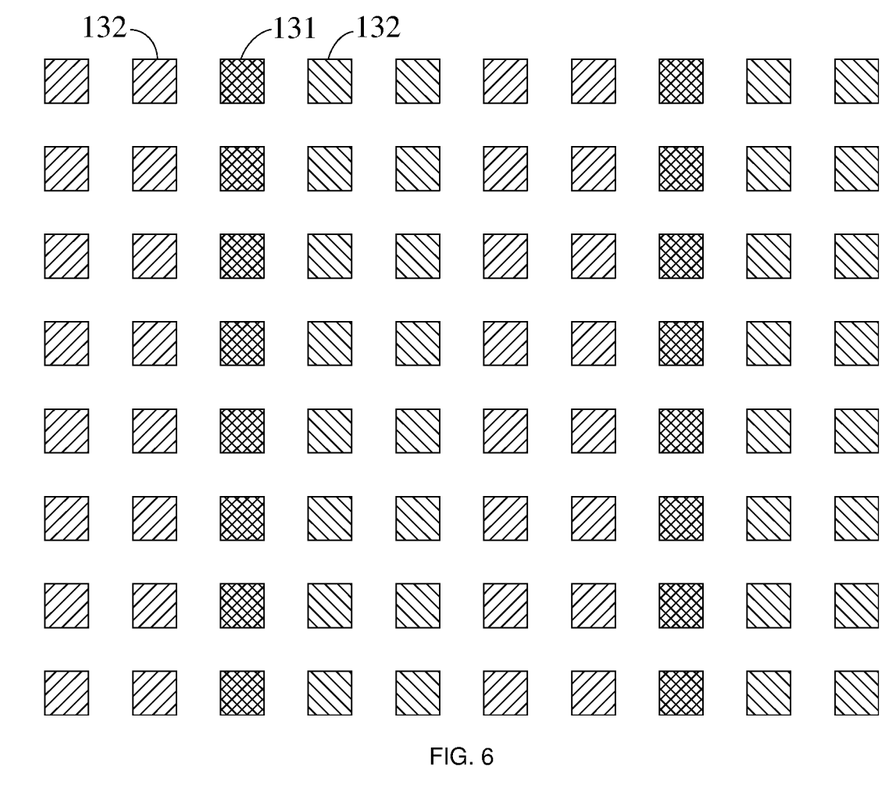
FIG. 6 is a schematic arrangement diagram of through electrodes in another stacked semiconductor device.

In order to connect the channels CH2, CH3, CH6, and CH7, the same structure shown in FIG. 4 further needs to be provided to form four transmission paths. In this way, two through electrode sets are set on each die. For example, as shown in FIG. 5, at least one row of auxiliary through electrodes 131 are provided between two through electrode sets. The auxiliary through electrodes 131 are used to dissipate heat and reduce signal coupling interference. When a plurality of through electrode sets are provided on a die, as shown in FIG. 6, auxiliary through electrodes occupy a relatively large region, resulting in a relatively large size of the die, further affecting structural compactness of the stacked memory device.

Based on this, the present disclosure provides a semiconductor structure, through electrodes on a semiconductor die include a first auxiliary through electrode and a connection through electrode, and stacked semiconductor dies are connected through connection through electrodes, and the first auxiliary through electrode is surrounded by a plurality of connection through electrodes. Such arrangement can ensure a heat dissipation function of the first auxiliary through electrode and can arrange the through electrodes on the semiconductor die in a more compact manner, thereby reducing an area occupied by the through electrodes and thus reducing a size of the semiconductor structure.

Figure 7:
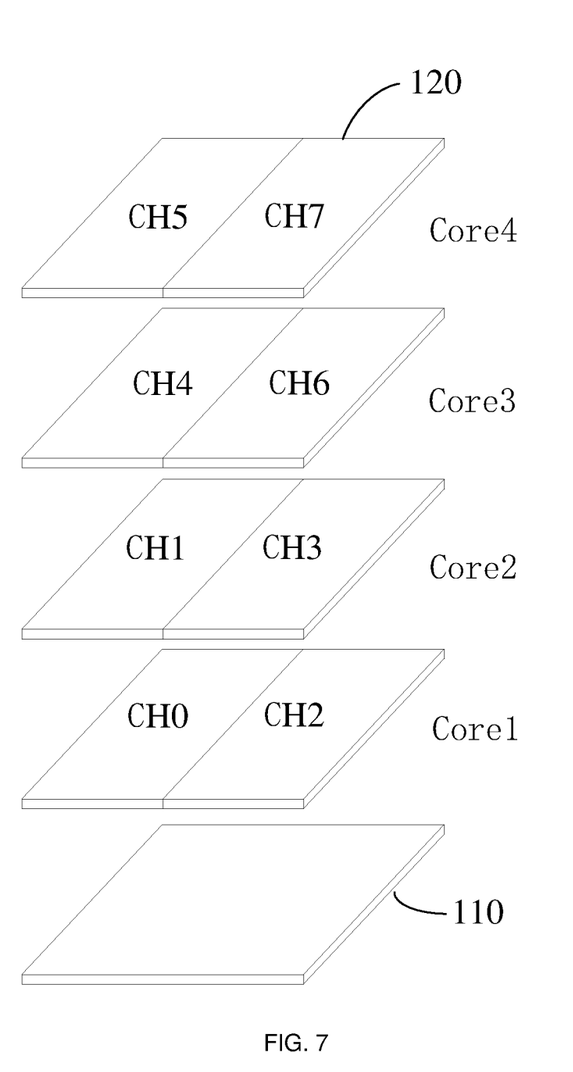
FIG. 7 is an exploded view of a semiconductor structure according to an exemplary embodiment.
Figure 8:
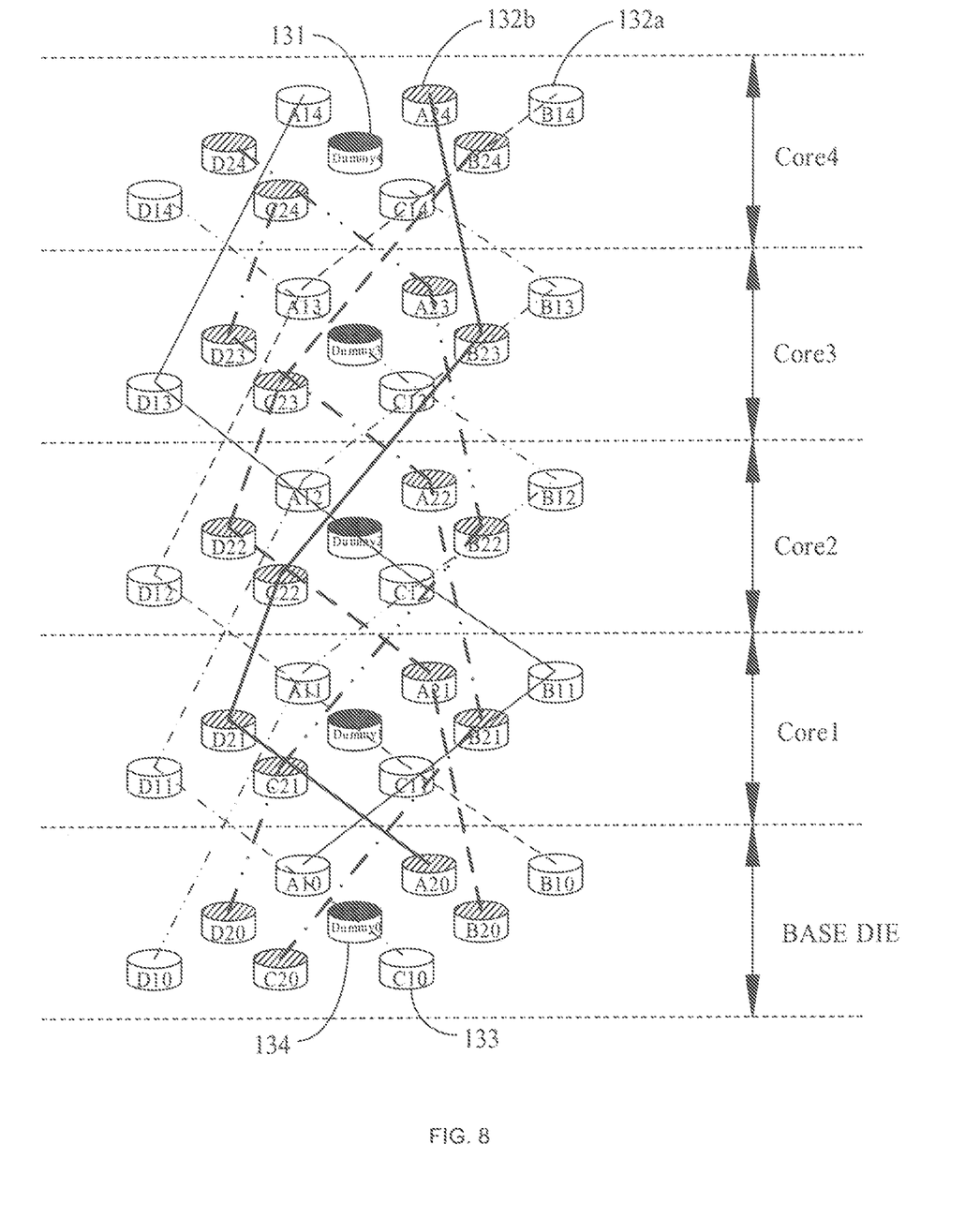
FIG. 8 is a schematic connection diagram of through electrodes in the semiconductor structure shown in FIG. 7.

An exemplary embodiment of the present disclosure provides a semiconductor structure. As shown in FIG. 7 and FIG. 8, the semiconductor structure includes a stacked structure. The stacked structure includes a plurality of stacked semiconductor dies 120. The stacked structure may be, for example, an HBM. Each of the semiconductor dies includes a first base, channels provided on the first base, and at least one first auxiliary through electrode 131 and a plurality of connection through electrodes 132 running through the first base. For example, the first base has a channel region and a through electrode region. The channel is located in the channel region. The first auxiliary through electrode 131 and the connection through electrodes 132 are located in the through electrode region. The connection through electrode 132 is used for electrical connection between the semiconductor dies 120 to form a transmission path. The first auxiliary through electrode 131 is used to dissipate heat and reduce signal coupling interference.

Connection through electrodes 132 of adjacent ones of the semiconductor dies 120 are connected through a first electrical connection structure to form a plurality of mutually isolated transmission paths. The first electrical connection structure may be, for example, a connection line. The transmission path is used for signal transmission. Each transmission path is connected to at least one channel through at least one connection through electrode 132 thereon to transmit a signal to the channel through the connection through electrode 132 on the transmission path.

Figure 9:
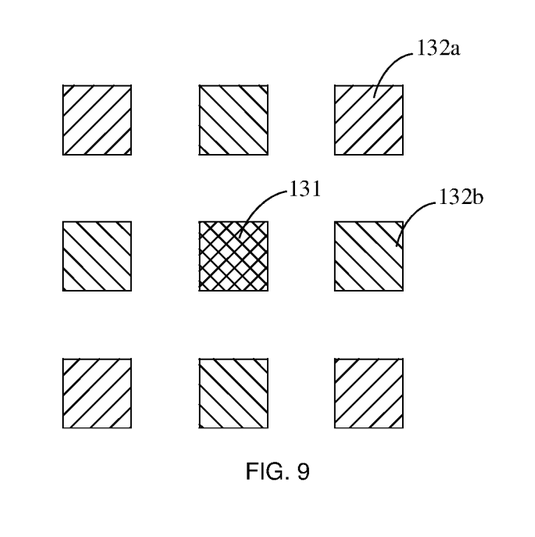
FIG. 9 is a schematic arrangement diagram of through electrodes in the semiconductor structure shown in FIG. 7.

The at least one first auxiliary through electrode 131 is surrounded by the plurality of connection through electrodes 132. It can be understood that "surrounded" herein may mean that the at least one first auxiliary through electrode 131 is surrounded by the plurality of connection through electrodes 132, that is, the plurality of connection through electrodes 132 are provided at an entire periphery of the at least one first auxiliary through electrode 131, that is, centers of the plurality of connection through electrodes 132 are connected to form a closed line, and the at least one first auxiliary through electrode 131 is located within the closed line. In an embodiment, in one of the semiconductor dies 120, the plurality of connection through electrodes 132 form at least one through electrode ring, and the at least one first auxiliary through electrode 131 is arranged in each through electrode ring. For example, as shown in FIG. 9, eight connection through electrodes 132 and one first auxiliary through electrode 131 are provided on one of the semiconductor die 120. Among the eight connection through electrodes 132, four connection through electrodes 132 are located at four vertices of a square, and the other four connection through electrodes 132 are respectively located at midpoints of four sides of the square. In this way, the eight connection through electrodes 132 form a square through electrode ring, and the first auxiliary through electrode 131 is located at a geometric center of the square through electrode ring. Certainly, it can be understood that the through electrode ring may alternatively be rectangular or in another shape. This is not limited in the present disclosure, provided that the through electrode ring can surround the first auxiliary through electrode 131.

"Surround" herein may alternatively be half surround, that is, the plurality of connection through electrodes 132 are located at a partial periphery of the at least one first auxiliary through electrode 131. For example, the plurality of connection through electrodes 132 form a half-ring structure, and the half-ring structure is provided around the partial periphery of the first auxiliary through electrode 131.

In the semiconductor structure provided in this embodiment of the present disclosure, the first auxiliary through electrode 131 is surrounded by a plurality of connection through electrodes 132. Such arrangement can ensure a heat dissipation function of the first auxiliary through electrode 131 and can arrange the through electrodes on the semiconductor die 120 in a more compact manner, thereby reducing an area occupied by the through electrodes and thus reducing a size of the semiconductor structure.

There may be one or more channels on each of the semiconductor dies 120. In this exemplary embodiment of the present disclosure, each of the semiconductor dies 120 is provided with at least two channels and at least two through electrode sets. Each of the through electrode sets includes a plurality of connection through electrodes 132. The connection through electrodes 132 in the at least two through electrode sets are alternately arranged around the at least one first auxiliary through electrode 131. The plurality of mutually isolated transmission paths correspondingly form at least two transmission path groups, and connection through electrodes 132 in a same through electrode set are respectively located on different transmission paths of a same transmission path group.

The "alternately arranged" herein means that among the connection through electrodes 132 surrounding the first auxiliary through electrode 131, adjacent ones of the connection through electrodes 132 belong to different through electrode sets. In this way, the connection through electrodes 132 of the adjacent ones of the semiconductor dies 120 can be easily connected and transmission paths can be easily isolated, such that the first auxiliary through electrode 131 and the connection through electrodes 132 are arranged in a more compact manner, thereby making an area occupied by the through electrode region smaller and the volume of the semiconductor structure smaller.

In an exemplary embodiment, as shown in FIG. 7, the at least two channels on each of the semiconductor dies 120 include a first channel and a second channel, that is, each of the semiconductor dies 120 is provided with two channels. The at least two through electrode sets on each of the semiconductor dies 120 include a first through electrode set and a second through electrode set. Connection through electrodes in the first through electrode set are each a first through electrode 132a. Connection through electrodes in the second through electrode set are each a second through electrode 132b.

In one of the semiconductor dies, as shown in FIG. 9, the first through electrodes 132a and the second through electrodes 132b are alternately arranged around the at least one first auxiliary through electrode 131, that is, the first through electrodes 132a and the second through electrodes 132b are alternately arranged at the periphery of the at least one first auxiliary through electrode 131 according to a rule of a first through electrode 132a, a second through electrode 132b, a first through electrode 132a, a second through electrode 132b, . . . , and so on. For example, as shown in FIG. 7, four semiconductor dies 120: a die Core1, a die Core2, a die Core3, and a die Core4 are provided in the semiconductor structure. As shown in FIG. 9, in each of the semiconductor dies 120, one first through electrode set includes four first through electrodes 132a, and one second through electrode set includes four second through electrodes 132b. The four first through electrodes 132a and the four second through electrodes 132b are alternately arranged around one first auxiliary through electrode 131 to form a through unit in a 3×3 array.

Still referring to FIG. 8, a first through electrode set on the die Core1 includes four first through electrodes 132a: through electrodes A11, B11, C11, and D11, and a second through electrode set on the die Core1 includes four second through electrodes 132b: through electrodes A21, B21, C21, and D21. A first auxiliary through electrode Dummy1 on the die Core1 is located within a through electrode ring formed by alternately arranging the four first through electrodes 132a and the four second through electrodes 132b. A first through electrode set on the die Core2 includes four first through electrodes 132a: is through electrodes A12, B12, C12, and D12, and a second through electrode set on the die Core2 includes four second through electrodes 132b: through electrodes A22, B22, C22, and D22. A first auxiliary through electrode Dummy2 on the die Core2 is located within a through electrode ring formed by alternately arranging the four first through electrodes 132a and the four second through electrodes 132b. A first through electrode set on the die Core3 includes four first through electrodes 132a: through electrodes A13, B13, C13, and D13, and a second through electrode set on the die Core3 includes four second through electrodes 132b: through electrodes A23, B23, C23, and D23. A first auxiliary through electrode Dummy3 on the die Core3 is located within a through electrode ring formed by alternately arranging the four first through electrodes 132a and the four second through electrodes 132b. A first through electrode set on the die Core4 includes four first through electrodes 132a: through electrodes A14, B14, C14, and D14, and a second through electrode set on the die Core4 includes four second through electrodes 132b: through electrodes A24, B24, C24, and D24. A first auxiliary through electrode Dummy4 on the die Core4 is located within a through electrode ring formed by alternately arranging the four first through electrodes 132a and the four second through electrodes 132b.

The first through electrodes 132a on the semiconductor dies 120 are connected to form a transmission path group, transmission paths in the transmission path group are first transmission paths, and each of the first transmission paths is connected to one first channel. The second through electrodes 132b on the semiconductor dies 120 are connected to form a transmission path group, transmission paths in the transmission path group are second transmission paths, and each of the second transmission paths is connected to one second channel.

Still using FIG. 8 as an example, the first through electrodes 132a on the four semiconductor dies 120 are connected to form a transmission path group, and the transmission path group includes four first transmission paths, which are specifically:

a transmission path 1 (bold dash-dotted line): B21-A22-D23-C24;

a transmission path 2 (bold dash-double-dotted line): C21-B22-A23-D24;

a transmission path 3 (bold straight line): D21-C22-B23-A24; and a transmission path 4 (bold dashed line): A21-D22-C23-B24.

Each of the transmission paths in the transmission path group is connected to a first channel of one semiconductor die 120. As shown in FIG. 8, specifically, a first channel on the die Core1 is a channel CH0, a first channel on the die Core2 is a channel CH1, a first channel on the die Core3 is a channel CH4, and a first channel on the die Core4 is a channel CH5. The through electrode B21 in the transmission path 1 is connected to the channel CH0 on the die Core1. The through electrode B22 in the transmission path 2 is connected to the channel CH1 on the die Core2. The through electrode B23 in the transmission path 3 is connected to the channel CH4 on the die Core3. The through electrode B24 in the transmission path 4 is connected to the channel CH5 on the die Core4.

The second through electrodes 132b on the four semiconductor dies 120 are connected to form a transmission path group, and the transmission path group includes four second transmission paths, which are specifically:

a transmission path 5 (thin dash-double-dotted line): A11-B12-C13-D14;

a transmission path 6 (thin dash-dotted line): D11-A12-B13-C14;

a transmission path 7 (thin dashed line): C11-D12-A13-B14; and a transmission path 8 (thin solid line): B11-C12-D13-A14.

Each of the transmission paths in the transmission path group is connected to a second channel of one semiconductor die 120. As shown in FIG. 8, specifically, a second channel on the die Core1 is a channel CH2, a second channel on the die Core2 is a channel CH3, a second channel on the die Core3 is a channel CH6, and a second channel on the die Core4 is a channel CH7. A through electrode A11 in the transmission path 5 is connected to the channel CH2 on the die Core1. A through electrode A12 in the transmission path 6 is connected to the channel CH3 on the die Core2. A through electrode A13 in the transmission path 7 is connected to the channel CH6 on the die Core3. A through electrode A14 in the transmission path 8 is connected to the channel CH7 on the die Core4.

In an exemplary embodiment, each of the first transmission paths is a spiral path extending spirally along a first direction. For example, as shown in FIG. 8, each of the first transmission paths extends spirally along a clockwise direction. Each of the second transmission paths is a spiral path extending spirally along a second direction. The second direction is opposite to the first direction. For example, as shown in FIG. 8, each of the second transmission paths extends spirally along a counterclockwise direction. In this way, the first transmission paths are provided along the clockwise direction and the second transmission paths are provided along the counterclockwise direction, making it easier to arrange and isolate the transmission paths from each other.

In an exemplary embodiment, positions of channels on all of the semiconductor dies 120 are in a one-to-one correspondence, and transmission paths in a same transmission path group are respectively connected to channels at corresponding positions on the semiconductor dies 120, that is, transmission paths connected to the channels at the corresponding positions are located in a same transmission path group, such that each of the transmission paths can transmit a signal to a corresponding channel. For example, in FIG. 7, positions of the channel CH0 on the die Core1, the channel CH1 on the die Core2, the channel CH4 on the die Core3, and the channel CH5 on the die Core4 correspond to one another in a vertical direction, and in a same transmission path group, the transmission path 1 is connected to the channel CH0, the transmission path 2 is connected to the channel CH1, the transmission path 3 is connected to the channel CH4, and the transmission path 4 is connected to the channel CH5. For another example, in FIG. 7, positions of the channel CH2 on the die Core1, the channel CH3 on the die Core2, the channel CH6 on the die Core3, and the channel CH7 on the die Core4 correspond to one another in a vertical direction, and in a same transmission path group, the transmission path 5 is connected to the channel CH2, the transmission path 6 is connected to the channel CH3, the transmission path 7 is connected to the channel CH6, and the transmission path 8 is connected to the channel CH7.

In an exemplary embodiment, positions of connection through electrodes 132 connected to the channels at the corresponding positions are in a one-to-one correspondence, such that structures of the semiconductor dies 120 are unified, thereby facilitating layout design of each layer of the semiconductor structure and improving production efficiency. For example, in FIG. 7, positions of the channel CH0 on the die Core1, the channel CH1 on the die Core2, the channel CH4 on the die Core3, and the channel CH5 on the die Core4 correspond to one another in a vertical direction. With reference to FIG. 8, the connection through electrode 132 connected to the channel CH0 in the die Core1 is the through electrode B21, the connection through electrode 132 connected to the channel CH1 in the die Core2 is the through electrode B22, the connection through electrode 132 connected to the channel CH4 in the die Core3 is the through electrode B23, and the connection through electrode 132 connected to the channel CH5 in the die Core4 is the through electrode B24. As shown in FIG. 8, positions of the through electrode B21, the through electrode B22, the through electrode B23, and the through electrode B24 are also in a one-to-one correspondence in the vertical direction. For another example, in FIG. 7, positions of the channel CH2 on the die Core1, the channel CH3 on the die Core2, the channel CH6 on the die Core3, and the channel CH7 on the die Core4 correspond to one another in a vertical direction. With reference to the FIG. 8, the connection through electrode 132 connected to the channel CH2 in the die Core1 is the through electrode A11, the connection through electrode 132 connected to the channel CH3 in the die Core2 is the through electrode A12, the connection through electrode 132 connected to the channel CH6 in the die Core3 is the through electrode A13, and the connection through electrode 132 connected to the channel CH7 in the die Core4 is the through electrode A14. As shown in FIG. 8, positions of the through electrode A11, the through electrode A12, the through electrode A13, and the through electrode A14 are also in a one-to-one correspondence in the vertical direction.

Figure 10:
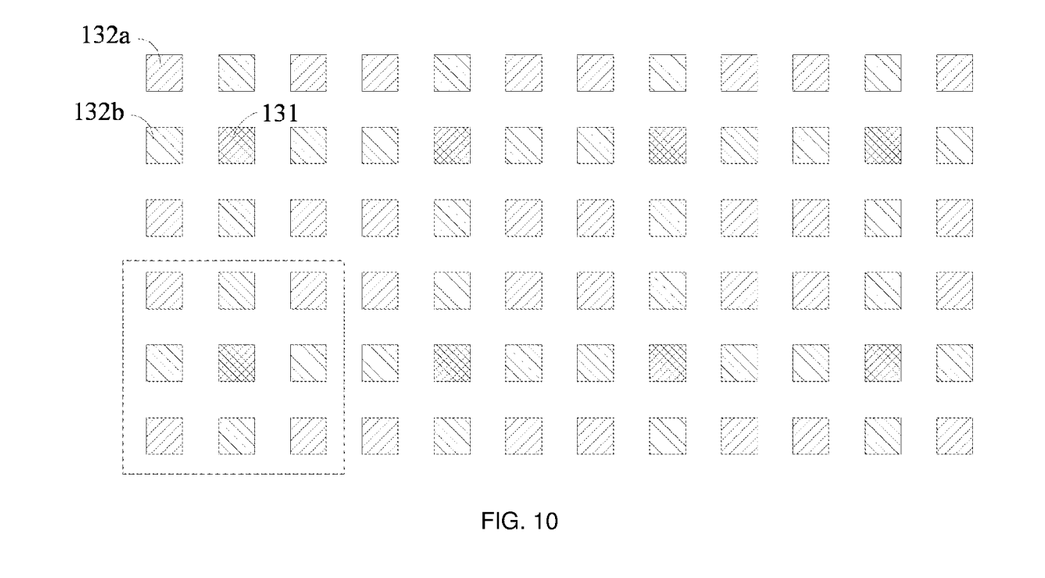
FIG. 10 is a schematic arrangement diagram of through electrodes in a semiconductor structure according to an exemplary embodiment.

Further, the at least two channels on each of the semiconductor dies 120 includes a plurality of first channels and a plurality of second channels in a one-to-one correspondence with the plurality of first channels. The at least two through electrode sets on each of the semiconductor dies 120 include a plurality of first through electrode sets and a plurality of second through electrode sets in a one-to-one correspondence with the plurality of first through electrode sets. Each of the first through electrode sets and a corresponding second through electrode set form a through unit. For example, in an embodiment shown in FIG. 10, four first through electrodes 132a and four second through electrodes 132b constitute a through unit. A dashed line box in the figure is a through unit. A plurality of through units are arranged in an array to further arrange the through electrodes in a more compact manner. As shown in FIG. 10, a 4×2 through unit array is formed, and one first auxiliary through electrode 131 is provided in each through unit. It can be learned through comparison between FIG. 6 and FIG. 10 that, compared with a conventional arrangement manner, the through electrode arrangement manner provided in the embodiments of the present disclosure can reduce the occupied area by 10%.

In an exemplary embodiment, each transmission path formed by the corresponding first through electrode set and second through electrode set in each of the semiconductor dies 120 is used for a connection to a same signal source. For example, each transmission path formed by the first through electrode set and the second through electrode set is used for a connection to a signal source DQ1, such that pins of a same signal source are provided centrally.

Still referring to FIG. 7 and FIG. 8, the semiconductor structure includes a buffer layer 110 provided below the stacked structure. The buffer layer 110 includes a second base and a plurality of transfer through electrodes 133 running through the second base. The plurality of transfer through electrodes 133 are respectively connected to a plurality of the transmission paths, and signals are transmitted to the transmission paths through the plurality of transfer through electrodes 133. For example, as shown in FIG. 8, the plurality of transfer through electrodes 133 on the buffer layer 110 are respectively through electrodes A10, B10, C10, and D10 and through electrodes A20, B20, C20, and D20. The through electrode A10 is connected to the transmission path 8. The through electrode B10 is connected to the transmission path 7. The through electrode C10 is connected to the transmission path 6. The through electrode D10 is connected to the transmission path 5. The through electrode A20 is connected to the transmission path 3. The through electrode B20 is connected to the transmission path 4. The through electrode C20 is connected to the transmission path 1. The through electrode D20 is connected to the transmission path 2.

It can be understood that, the first auxiliary through electrode 131 may be used for heat dissipation of the semiconductor structure. In addition, the first auxiliary through electrodes 131 in all of the semiconductor dies 120 are connected together through a second electrical connection structure and grounded. The second electrical connection structure may be, for example, a connection line. The first auxiliary through electrodes 131 are grounded, such that signal coupling interference between the transmission paths can be effectively reduced.

For example, positions of the first auxiliary through electrodes 131 in all of the semiconductor dies 120 are in a one-to-one correspondence. For example, as shown in FIG. 8, positions of the first auxiliary through electrode Dummy1 on the die Core1, the first auxiliary through electrode Dummy2 on the die Core2, the first auxiliary through electrode Dummy3 on the die Core3, and the first auxiliary through electrode Dummy4 on the die Core4 are in a one-to-one correspondence in a vertical direction, thereby facilitating connections between the first auxiliary through electrodes 131.

Referring to FIG. 8, the buffer layer 110 further includes a second auxiliary through electrode 134 running through the second base. The first auxiliary through electrodes 131 in all of the semiconductor dies 120 are connected together through a second electrical connection structure and connected to the second auxiliary through electrode 134. One end of the second auxiliary through electrode 134 facing away from the stacked structure is provided with a ground terminal, such that the first auxiliary through electrodes 131 are grounded through the second auxiliary through electrode 134.

Figure 11:
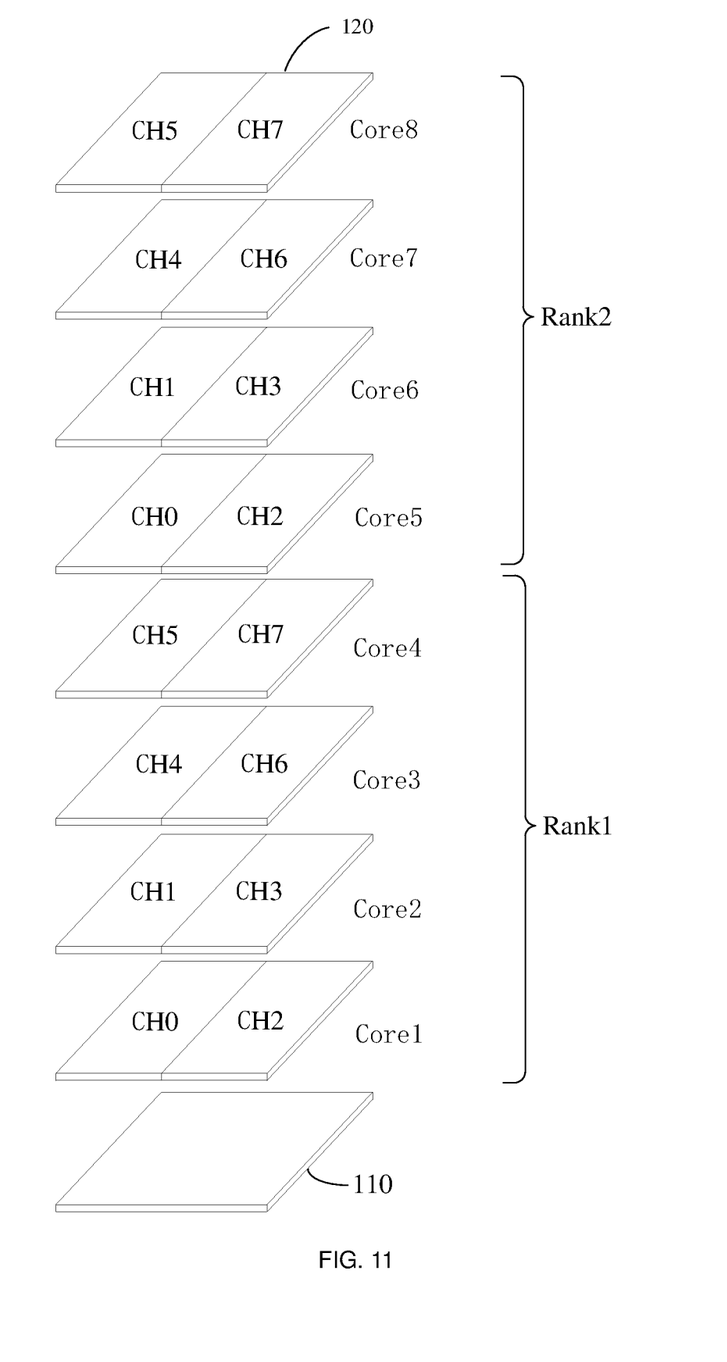
FIG. 11 is an exploded view of a semiconductor structure according to an exemplary embodiment.
Figure 12:
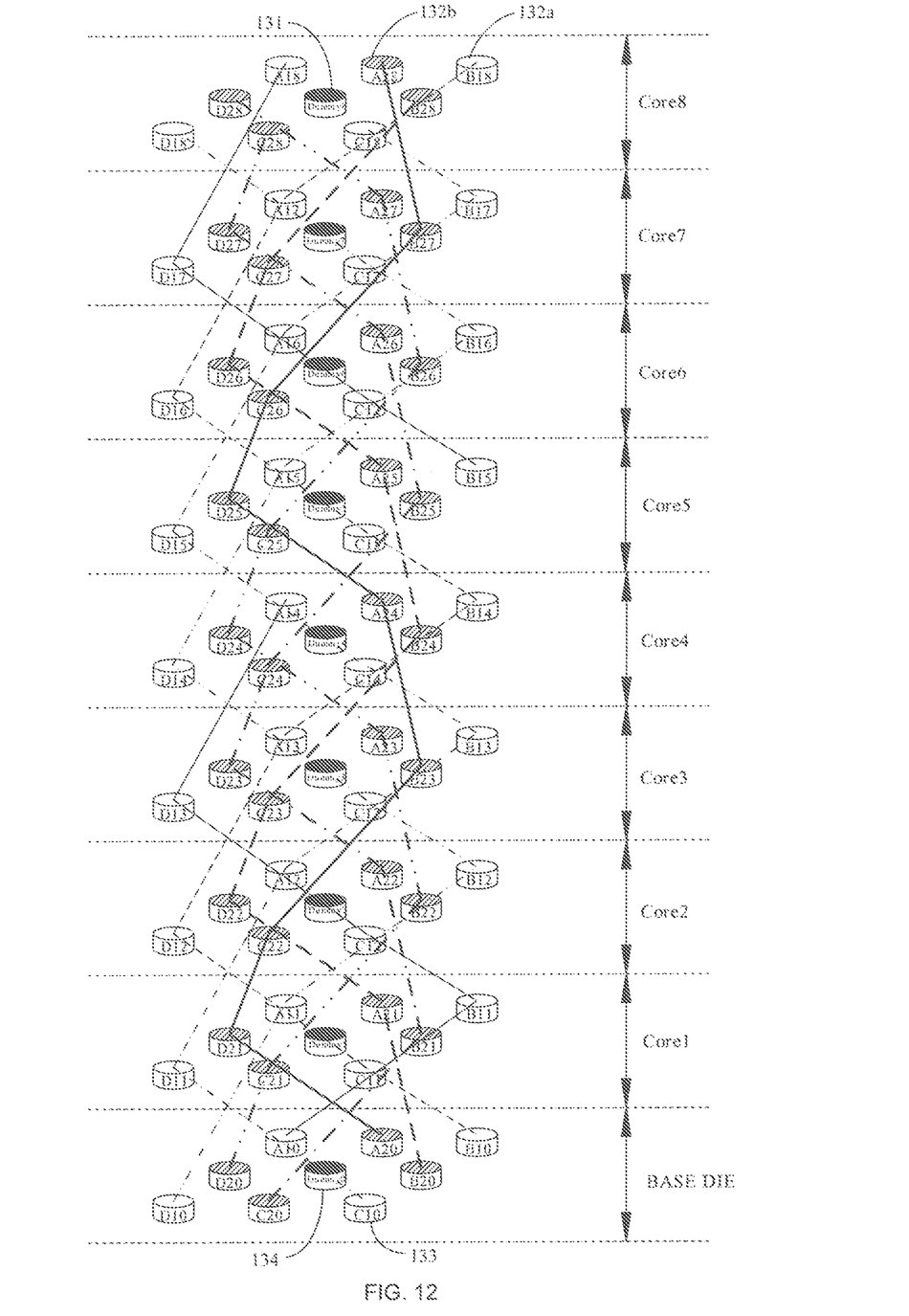
FIG. 12 is a schematic connection diagram of through electrodes in the semiconductor structure shown in FIG. 11.

In an exemplary embodiment, as shown in FIG. 11 and FIG. 12, the plurality of semiconductor dies 120 form at least two semiconductor die sets. The semiconductor dies 120 in the semiconductor die sets are in a one-to-one correspondence. Each of the transmission paths is connected to a channel on corresponding semiconductor dies 120 in the semiconductor die sets. For example, as shown in FIG. 11, the plurality of semiconductor dies form two semiconductor die sets: a die set Rank1 and a die set Rank2. Each of the semiconductor die sets includes four semiconductor dies. Specifically, the four semiconductor dies in the die set Rank1 are sequentially a die Core1, a die Core2, a die Core3, and a die Core4, and the four semiconductor dies in the die set Rank2 are sequentially a die Core5, a die Core6, a die Core7, and a die Core8. The die Core1 corresponds to the die Core5, the die Core2 corresponds to the die Core6, the die Core3 corresponds to the die Core7, and the die Core4 corresponds to the die Core8.

As shown in FIG. 12, a first through electrode set on the die Core5 includes four first through electrodes 132*a*: through electrodes A15, B15, C15, and D15, and a second through electrode set on the die Core1 includes four second through electrodes 132*b*: through electrodes A25, B25, C25, and D25. A first auxiliary through electrode Dummy5 on the die Core5 is located within a through electrode ring formed by alternately arranging the four first through electrodes 132*a* and the four second through electrodes 132*b*. A first through electrode set on the die Core6 includes four first through electrodes 132*a*: through electrodes A16, B16, C16, and D16, and a second through electrode set on the die Core6 includes four second through electrodes 132*b*: through electrodes A26, B26, C26, and D26. A first auxiliary through electrode Dummy6 on the die Core6 is located within a through electrode ring formed by alternately arranging the four first through electrodes 132*a* and the four second through electrodes 132*b*. A first through electrode set on the die Core7 includes four first through electrodes 132*a*: through electrodes A17, B17, C17, and D17, and a second through electrode set on the die Core7 includes four second through electrodes 132*b*: through electrodes A27, B27, C27, and D27. A first auxiliary through electrode Dummy7 on the die Core7 is located within a through electrode ring formed by alternately arranging the four first through electrodes 132*a* and the four second through electrodes 132*b*. A first through electrode set on the die Core8 includes four first through electrodes 132*a*: through electrodes A18, B18, C18, and D18, and a second through electrode set on the die Core8 includes four second through electrodes 132*b*: through electrodes A28, B28, C28, and D28. A first auxiliary through electrode Dummy8 on the die Core8 is located within a through electrode ring formed by alternately arranging the four first through electrodes 132*a* and the four second through electrodes 132*b*.

As shown in FIG. 12, a total of eight transmission paths are formed in the semiconductor structure, which are specifically:

a transmission path 1 (bold dash-dotted line): B21-A22-D23-C24-B25-A26-D27-C28;

a transmission path 2 (bold dash-double-dotted line): C21-B22-A23-D24-C25-B26-A27-D28;

a transmission path 3 (bold straight line): D21-C22-B23-A24-D25-C26-B27-A28;

a transmission path 4 (bold dashed line): A21-D22-C23-B24-A25-D26-C27-B28;

a transmission path 5 (thin dash-double-dotted line): A11-B12-C13-D14-A15-B16-C17-D18;

a transmission path 6 (thin dash-dotted line): D11-A12-B13-C14-D15-A16-B17-C18;

a transmission path 7 (thin dashed line): C11-D12-A13-B14-C15-D16-A17-B18; and a transmission path 8 (thin solid line): B11-C12-D13-A14-B15-C16-D17-A18.

The transmission path 1 is connected to the channel CH0 on each of the die Core1 and the die Core5. The transmission path 2 is connected to the channel CH1 on each of the die Core2 and the die Core6. The transmission path 3 is connected to the channel CH4 on each of the die Core3 and the die Core7. The transmission path 4 is connected to the channel CH5 on each of the die Core4 and the die Core8. The transmission path 5 is connected to the channel CH2 on each of the die Core1 and the die Core5. The transmission path 6 is connected to the channel CH3 on each of the die Core2 and the die Core6. The transmission path 7 is connected to the channel CH6 on each of the die Core3 and the die Core7. The transmission path 8 is connected to the channel CH7 on each of the die Core4 and the die Core8.

In the semiconductor structure provided in the embodiments of the present disclosure, through electrodes on a semiconductor die 120 include a first auxiliary through electrode 131 and a connection through electrode 132, and stacked semiconductor dies 120 are connected through connection through electrodes 132, and the first auxiliary through electrode 131 is surrounded by a plurality of connection through electrodes 132. Such arrangement can ensure a heat dissipation function of the first auxiliary through electrode 131 and can arrange the through electrodes on the semiconductor die 120 in a more compact manner, thereby reducing an area occupied by the through electrodes and thus reducing a size of the semiconductor structure.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure provided in the embodiments of the present disclosure, through electrodes on a semiconductor die include a first auxiliary through electrode and a connection through electrode, and stacked semiconductor dies are connected through connection through electrodes, and the first auxiliary through electrode is surrounded by a plurality of connection through electrodes. Such arrangement can ensure a heat dissipation function of the first auxiliary through electrode and can arrange the through electrodes on the semiconductor die in a more compact manner, thereby reducing an area occupied by the through electrodes and thus reducing a size of the semiconductor structure.

The invention claimed is:

1. A semiconductor structure, comprising
a stacked structure, wherein the stacked structure comprises a plurality of stacked semiconductor dies, and each of the semiconductor dies comprises:
at least one first auxiliary through electrode and a plurality of connection through electrodes;
each of the semiconductor dies comprises a first through electrode set and a second through electrode set, each of the through electrode sets comprises the plurality of connection through electrodes, the connection through electrodes in the first through electrode set are first through electrodes, the connection through electrodes in the second through electrode set are second through electrodes; in one of the semiconductor dies, the first through electrodes and the second through electrodes are alternately arranged around the at least one first auxiliary through electrode;
the first through electrodes on each of the semiconductor dies are connected to each other to form a transmission path groups, transmission paths in the transmission path group are first transmission paths;
the second through electrodes on each of the semiconductor dies are connected to each other to form another transmission path group, transmission paths in another transmission path group are second transmission paths;
wherein each of the first transmission paths is a spiral path extending spirally along a first direction; and
each of the second transmission paths is a spiral path extending spirally along a second direction, and the second direction is opposite to the first direction.

2. The semiconductor structure according to claim 1, wherein
each of the connection through electrodes in the same first through electrode set are respectively located on different transmission paths; and
each of the connection through electrodes in the second through electrode set are respectively located on different transmission paths.

3. The semiconductor structure according to claim 1, wherein
each of the semiconductor dies comprise a plurality of first through electrode sets and a plurality of second through electrode sets in a one-to-one correspondence with the plurality of first through electrode sets, each of the first through electrode sets and a corresponding second through electrode set form a through unit, and a plurality of the through units are arranged in an array.

4. The semiconductor structure according to claim 1, wherein
each of the transmission paths formed by the corresponding first through electrode set and second through electrode set in each of the semiconductor dies is used for a connection to a same signal source.

5. The semiconductor structure according to claim 1, wherein
the first through electrode sets comprises four first through electrodes, the second through electrode sets comprises four second through electrodes, and the four first through electrodes and the four second through electrodes are alternately arranged around one first auxiliary through electrode to form a through unit in a 3×3 array.

6. The semiconductor structure according to claim 1, wherein
the first auxiliary through electrodes in all of the semiconductor dies are connected together and grounded.

7. The semiconductor structure according to claim 1, wherein
the semiconductor structure comprises a buffer layer provided below the stacked structure, the buffer layer comprises a plurality of transfer through electrodes, and the plurality of transfer through electrodes are respectively connected to the transmission paths.

8. The semiconductor structure according to claim 7, wherein
the buffer layer comprises a second auxiliary through electrode, the first auxiliary through electrodes in all of the semiconductor dies are connected together and connected to the second auxiliary through electrode, and one end of the second auxiliary through electrode facing away from the stacked structure is provided with a ground terminal.

* * * * *